(12) United States Patent
Hairston et al.

(10) Patent No.: US 12,666,176 B2
(45) Date of Patent: Jun. 23, 2026

(54) AUTOMATIC INTEGRATION AND READOUT GAIN READ OUT INTEGRATED CIRCUIT (ROIC)

(71) Applicant: BAE Systems Information and Electronic Systems Integration Inc., Nashua, NH (US)

(72) Inventors: Allen W. Hairston, Andover, MA (US); Dimitre P. Dimitrov, Wayland, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 78 days.

(21) Appl. No.: 18/840,208

(22) PCT Filed: Feb. 25, 2022

(86) PCT No.: PCT/US2022/017809
§ 371 (c)(1),
(2) Date: Aug. 21, 2024

(87) PCT Pub. No.: WO2023/163707
PCT Pub. Date: Aug. 31, 2023

(65) Prior Publication Data
US 2025/0168533 A1      May 22, 2025

(51) Int. Cl.
*H04N 25/78* (2023.01)
*G01R 19/165* (2006.01)
(Continued)

(52) U.S. Cl.
CPC ....... *H04N 25/78* (2023.01); *G01R 19/16576* (2013.01); *H04N 25/583* (2023.01); *H04N 25/589* (2023.01); *H04N 25/778* (2023.01)

(58) Field of Classification Search
CPC .. H04N 25/583; H04N 25/589; H04N 25/778; H04N 25/78; G01R 19/16576
See application file for complete search history.

(56) References Cited

U.S. PATENT DOCUMENTS

2003/0183756 A1    10/2003  Huniu
2004/0169753 A1*   9/2004   Gulbransen .......... H04N 25/589
                                                            348/E3.019
(Continued)

OTHER PUBLICATIONS

International Search Report, PCT/US22/17809, mailed Jun. 21, 2022, 24 pages.

*Primary Examiner* — Lin Ye
*Assistant Examiner* — Chriss S Yoder, III
(74) *Attorney, Agent, or Firm* — Gary McFaline; Maine Cernota & Curran

(57) ABSTRACT
A system for imaging includes both integration time gain and readout gain. It has a plurality of pixels comprising a frame, each pixel has a direct injection input with two Sample-and-Holds (SHs); a short integration time output; and a long integration time output. The integration time gain extends the range to higher fluxes with shorter integration times. A Read Out Integrated Circuit (ROIC) includes at least one column cell having a gain selection component where each of the short integration time output and the long integration time output are compared to a threshold, producing gain bits and an Analog to Digital Converter (ADC) producing data bits.

18 Claims, 8 Drawing Sheets

300

EMBODIMENT AUTOMATIC INTEGRATION AND READOUT GAIN COMPONENT DETAIL

(51) Int. Cl.
    *H04N 25/583*       (2023.01)
    *H04N 25/589*       (2023.01)
    *H04N 25/778*       (2023.01)

(56)               References Cited

U.S. PATENT DOCUMENTS

| | | | |
|---|---|---|---|
| 2008/0218614 A1* | 9/2008 | Joshi | H04N 25/587 |
| | | | 348/262 |
| 2014/0197878 A1* | 7/2014 | Sun | G01J 5/10 |
| | | | 327/434 |
| 2017/0195596 A1 | 7/2017 | Vogelsang et al. | |
| 2021/0377461 A1* | 12/2021 | Hammer | G01T 1/17 |
| 2021/0377470 A1* | 12/2021 | Malone | H04N 25/571 |

* cited by examiner

100

AUTOMATIC INTEGRATION AND READOUT GAIN COMPONENT OVERVIEW

200

HIGH LEVEL AUTOMATIC INTEGRATION AND READOUT GAIN COMPONENTS

300

EMBODIMENT AUTOMATIC INTEGRATION AND READOUT GAIN COMPONENT DETAIL

400

EMBODIMENT AUTOMATIC INTEGRATION AND READOUT GAIN COMPONENT DETAIL

500

505
INITIATE READOUT

510
PHASE ONE: READOUT GAIN SELECTION

515
PHASE TWO: INTEGRATION GAIN SELECTION

520
PHASE THREE: FINAL SETTLING BEFORE
SAMPLE-AND-HOLD

525
GAIN AND DATA SENT TO AN OUTPUT DATA MUX

METHOD STEPS

600

PHASE ONE: READOUT GAIN SELECTION

700

515
PHASE TWO: INTEGRATION GAIN SELECTION

705
OBTAIN LONG INTEGRATION READOUT

710
SELECT READOUT GAIN FROM PHASE ONE

715
THRESHOLD
?

Y

N

720
SWITCH TO
SHORT INTEGRATION
READOUT

725
KEEP
LONG INTEGRATION
READOUT

PHASE TWO: INTEGRATION GAIN SELECTION

800

PHASE THREE: FINAL SETTLING BEFORE SAMPLE-AND-HOLD

AUTOMATIC INTEGRATION AND READOUT GAIN READ OUT INTEGRATED CIRCUIT (ROIC)

FIELD OF THE DISCLOSURE

The disclosure relates generally to imaging devices and methods and, more specifically, to automatic integration and readout gain for Read Out Integrated Circuits (ROICs) and methods of operating ROICs.

BACKGROUND

Digital detection of images is a very widely used technology, having applications ranging from consumer-oriented cameras and video apparatuses to law enforcement and military equipment. For virtually all of these applications, there is a growing demand for higher image pixel counts, higher pixel density, increased sensitivity, improved dynamic range, lower power consumption, faster image processing, and the ability to switch between modes offering different balances of these characteristics, dependent on the requirements present at a given time.

At the heart of all digital imaging systems is the Focal Plane Array (FPA), which is a two-dimensional array of elements upon which an image is focused, whereby each of the FPA elements or pixels develops an analog output signal charge that is proportional to the intensity of the electromagnetic radiation that is impinging on it after a given interval of time. This signal charge can then be stored, measured, and used to produce an image.

The storage and measurement of the electromagnetic radiation that has impinged on a pixel over a given amount of time is accomplished using a Read-Out Integrated Circuit (ROIC). Some existing digital pixel ROICs use counter latches for both storage and readout of data, preventing simultaneous readout and integration. This reduces the time available for both integration and readout, reducing sensitivity and increasing required data rates for moving information off of the chip, respectively. Previous techniques for extending the dynamic range of ROICs used either dual readout gain or dual integration time. Neither of these meets current operational specification requirements.

Next generation sensor components such as Missile Warning Systems' FPAs require the performance mentioned, including very high dynamic range, in a reasonably small, two simultaneous color pixel. A low risk, low power, lower cost ROIC design is also desired. Existing solutions use one of either automatic integration or readout gain, which does not support the necessary range. Digital pixel designs can provide the desired range, but are more complex with more design risk and in some cases, more expensive fabrication techniques with stacked ROICs.

What is needed, therefore, are systems and methods for a ROIC that combines both short and long integration to extend the range to very high fluxes and automatic readout gain which reduces noise for very low fluxes in one ROIC for reasonable cost in a single layer ROIC design in the desired pixel size.

SUMMARY

An embodiment provides a device for imaging having both integration time gain and readout gain comprising a plurality of pixels comprising a frame, each the pixel comprising a first integration time output; and a second integration time output, wherein the duration time of the first integration time output is shorter than the duration time of the second integration time output; a Read Out Integrated Circuit (ROIC) comprising at least one column cell comprising a gain selection component wherein each of the first integration time output and the second integration time output are compared to a threshold, producing gain bits; and an Analog to Digital Converter (ADC) producing data bits from the first integration time output and the second integration time output of each of the plurality of pixels; wherein the column cell outputs the data bits from the ADC and the gain bits for each of the plurality of the pixels. In embodiments, each of the gain bits and the data bits is read out for each the pixel for each the frame. In other embodiments, gain selection of the gain selection component is based on the first integration time output signal and the second integration time output signal of that pixel for that frame. In subsequent embodiments the gain bits comprise two bits and the data bits comprise 14 bits. For additional embodiments the pixel comprises direct injection input with two Sample-and-Holds (SHs). In another embodiment, the pixel comprises a 20 Me– well. For a following embodiment a short integration time increases a maximum saturation flux by a ratio of a second integration time to a first integration time, which the device controls. In subsequent embodiments the column cell comprises an extra low noise amplifier and a 3:1 Mux with selection criteria; wherein the extra low noise amplifier receives input from the long integration time output and provides input to the 3:1 Mux with selection criteria, wherein the 3:1 Mux with selection criteria comprises three inputs and provides input to the ADC which provides the data bits output from the column cell. In additional embodiments the column cell comprises a first amplifier receiving input from the long integration sample output; a second amplifier receiving input from the short integration sample output; a ping-pong sample-and-hold that switches between outputs of the first amplifier and the second amplifier; a comparator receiving input from the first amplifier and an input of the threshold, wherein the threshold is a threshold voltage VthH, wherein an output of the comparator is provided to a latch providing the gain bits; wherein the ping-pong sample-and-hold provides input to the ADC.

Another embodiment provides a method for imaging having both integration time gain and readout gain comprising receiving, at a plurality of pixels, photons from an image; providing a first, short, integration time output and a second, long, integration time output from each pixel of the plurality of pixels; receiving the short, integration time output and the long integration time output at a gain selection component of a column cell of a Read Out Integrated Circuit (ROIC); comparing, in the gain selection component of the column cell, the pixel long integration time output and a gain to at least one threshold; determining a data bit output and a gain bit output from the comparison; whereby a dynamic range of the imaging method is extended. In included embodiments the method comprises three phases comprising a first phase comprising selection of the readout gain; a second phase comprising selection of the integration time gain; and a third phase comprising final settling before sample and hold. In yet further embodiments the first phase readout gain selection comprises establishing the readout gain in a high gain configuration; comparing a value of the long integration time output to a readout gain threshold; if the long integration time output value is greater than the readout gain threshold, then switching the high readout gain to a low readout gain configuration. In related embodiments the second phase integration time gain selection comprises comparing a value of the long integration time output multiplied by a readout gain to an integration time gain threshold; if the long integration time output value multiplied by the readout gain is greater than the integration time gain threshold, then switching to the short integration time output. For further embodiments the third phase final settling comprises maintaining a readout gain and an integration time gain; connecting to a capacitor of the sample-and-hold for final setting; outputting the gain bits; and outputting the data bits. In ensuing embodiments a readout gain threshold equals an integration time gain threshold. For yet further embodiments, the three phases are time periods in a readout line. For more embodiments, readout starts at a highest readout gain and lowers the gain if the output exceeds the threshold. In continued embodiments a short integration time increases a maximum saturation flux by a ratio of a long integration time to a short integration time, which the system controls. For additional embodiments, a short integration time increases the maximum saturation flux by a ratio of a long integration time to a short integration time, wherein the ratio is controlled by the imaging method.

A yet further embodiment provides a system for imaging having both integration time gain and readout gain comprising a plurality of pixels comprising a frame, each the pixel comprising a direct injection input with two Sample-and-Holds (SHs); a short integration time output; and a long integration time output, whereby the integration time gain extends a range to higher fluxes with shorter integration times; a Read Out Integrated Circuit (ROIC) comprising at least one column cell comprising a gain selection component wherein each of the short integration time output and the long integration time output are compared to a threshold producing gain bits; and an Analog to Digital Converter (ADC) producing data bits; wherein a first phase readout gain selection comprises establishing the readout gain in a high gain configuration; comparing a value of the long integration time output to a readout gain threshold; if the long integration time output value is greater than the readout gain threshold, then switching the high readout gain to a low readout gain configuration; wherein a second phase integration time gain selection comprises comparing a value of the long integration time output multiplied by a readout gain to an integration time gain threshold; if the long integration time output value multiplied by the readout gain is greater than the integration time gain threshold, then switching to the short integration time output; wherein a third phase final settling comprises: maintaining a readout gain and an integration time gain; connecting to a capacitor of the sample-and-hold for final setting; outputting the gain bits; and outputting the data bits; wherein the column cell outputs the data bits from the ADC and the gain bits for each the pixel; whereby a dynamic range of the imaging device is extended.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

Figure 1:
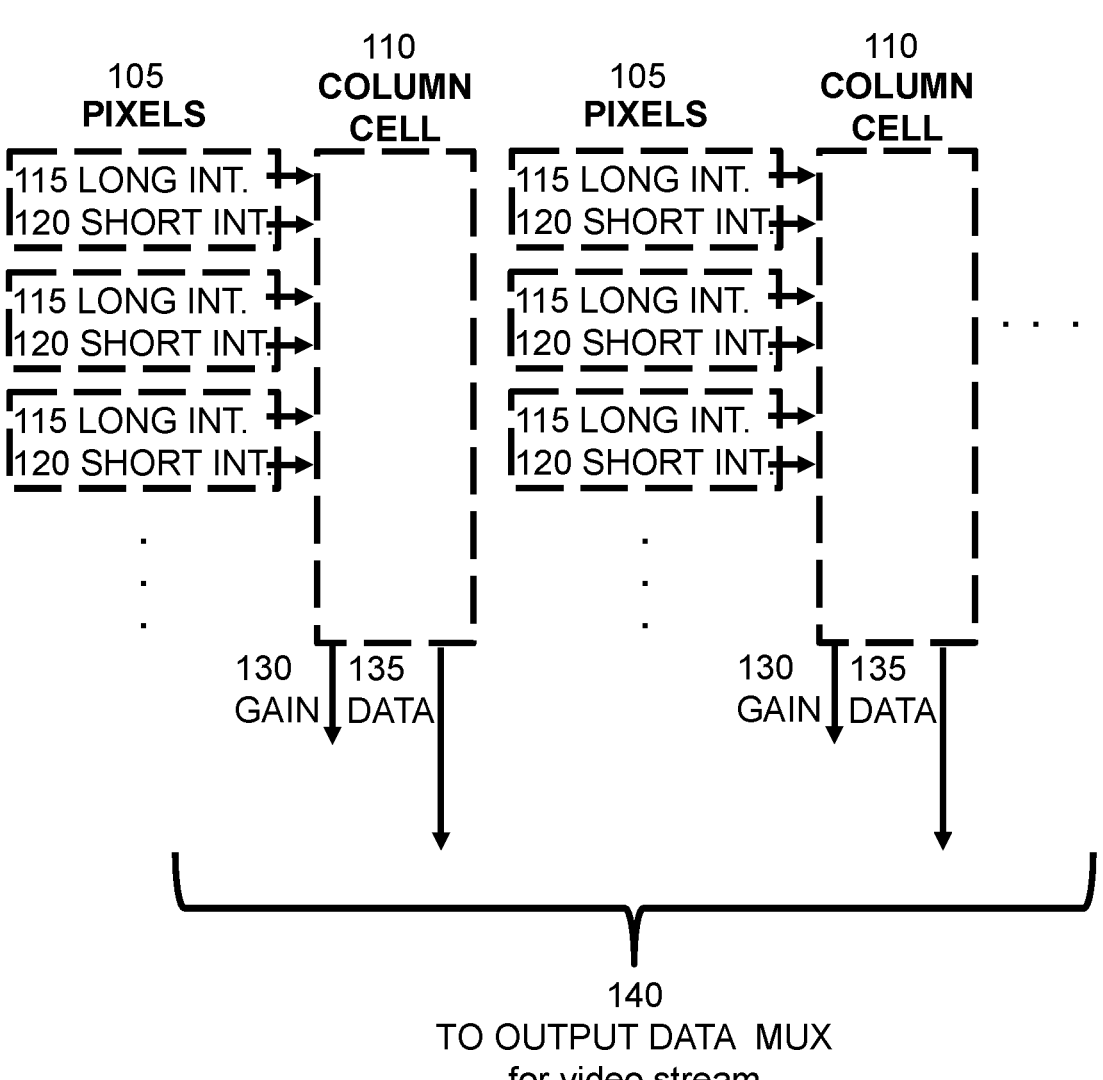
FIG. 1 is an overview depiction of a pixel and a ROIC column cell configured in accordance with one embodiment of the invention.

These and other features of the present embodiments will be understood better by reading the following detailed description, taken together with the figures herein described. The accompanying drawings are not intended to be drawn to scale. For purposes of clarity, not every component may be labeled in every drawing.

DETAILED DESCRIPTION

ROIC embodiments combine both short and long integration time (to extend the range to very high fluxes) and automatic readout gain (which reduces noise for very low fluxes) in a single ROIC. In embodiments, short and long integration are implemented for reasonable cost in a single-layer ROIC design in the desired pixel size.

A description of this use of both types of dual gain (dual integration time and dual readout gain) at the same time, and the specific technique used in implementing the gain decisions follows. Dual integration time is another form of dual gain, since ROIC transimpedance gain is proportional to integration time. Both of these techniques use two gains to allow use of higher gain with lower noise when the signals are smaller and lower gain to avoid saturation when signals are larger. The combination of the two gains creates a higher dynamic range. Readout gain lowers readout noise for low fluxes that do not fill up much of the integration capacitor.

Dual readout gain embodiments use a variable gain amplifier in the readout of the signal after it leaves the pixel. This gain allows the suppression of noise sources that occur after the gain. For many ROICs, a noise that occurs after the pixel (and determines the noise floor for small signals) is from the analog to digital conversion. So, a gain before the ADC reduces the effect of the ADC noise on the signal at the output by a factor of the gain. It does not reduce noise sources that occur before the gain. However, gain increases the output range of the signal such that signals greater than ADC output range/gain cause the ADC to saturate. Therefore, the gain is only useful for smaller signals, signals less than the output range/gain. Some ROICs readout two gains in order to get more range. Some ROICs choose the gain in the ROIC based on the range. If the output signal is less than range/gain and therefore can get lower noise without saturating, then the high readout gain is selected. If the output signal is more than the range/gain, then the lower readout gain is selected to avoid saturation.

Dual integration gain uses two different integration times for every frame of data, a long integration time and a short integration time. The long integration time integrates for as long as possible for maximum sensitivity. The short integration integrates for a much shorter time so that larger detector currents will not saturate the integration range. The two ranges are combined for high dynamic range.

As mentioned, embodiments combine both dual readout gain and dual integration time to give a triple gain: high, middle, and low. High gain is high readout gain with long integration time. This requires the lowest signals and has the lowest noise floor. The middle gain is low readout gain (gain=1) and long integration time. This is a typical gain for a ROIC with a middle range of signal and noise. The low gain is low readout gain and short integration time. The ROIC automatically chooses the gain for each pixel and outputs two gain bits along with signal voltage data. Gain selection is made by the ROIC based on the signal of that pixel for that frame.

The method for choosing the ROIC gain includes a decision made while the pixel integration signal is being transferred from the pixel to a sample and hold (SH) capacitor in the column cell, on the edge of the pixel array. This transfer takes one readout line, which also reads out all the data from a line. The readout process is pipelined, so that pixel to column SH transfer for one row takes place at the same time as ADC conversion of the second row and output of the digital data from the ROIC from a third row. From this, outputs proceed to an output data mux for the video stream as typically used in these applications. More details for the method are provided in the flow charts and table that follow the circuit depictions.

Generally, each frame samples a short and long integration time output in the pixel to be read out and both integration and readout automatic gains are used at the same time. Gain selection is made by the ROIC based on the signal of that pixel for that frame. The output level (14 bits) for the selected gain and the selected gain (2 bits) is read out for each pixel. Gain decisions are made during the readout from the pixel to column cell, using a three phase approach. The three phases are time periods in the readout line. Readout starts at the highest gain and lowers it if the output is too high. In the first of the three time periods the readout gain decision is made using the long integration time readout, starting with high readout gain. In the second time period the integration gain decision is made (starting with long integration time). In the third time period the final output level is settled at selected gains. In embodiments there is one row readout line from the pixel to the column cell on the periphery of the ROIC.

FIG. 1 depicts an overview of pixel and column cell components 100. Pixel 105 of a focal plane array provides input to column cell 110 of a read out integrated circuit. In embodiments, pixel 105 comprises a long integration sample output 115 and a short integration sample output 120. In embodiments, column cell 110 provides a 3:1 Mux with selection criteria and comprises an Analog to Digital Converter (ADC). Output of column cell 110 comprises gain 130 and data 135 to an output data Mux 140.

Figure 2:
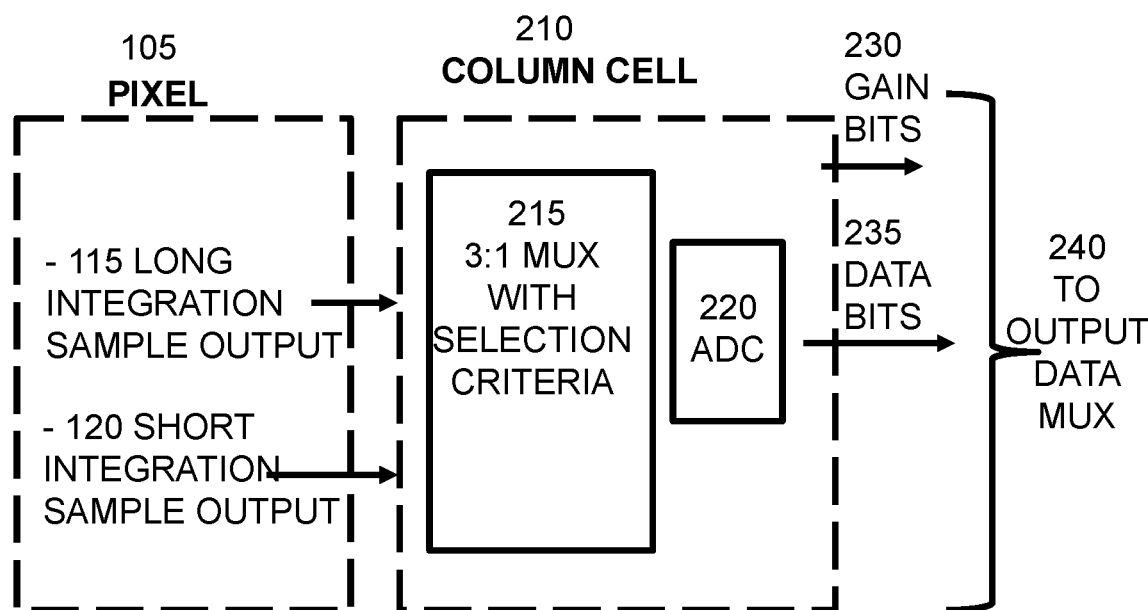
FIG. 2 is a general depiction of a pixel and a ROIC column cell configured in accordance with one embodiment of the invention.

FIG. 2 depicts general pixel and column cell components 200. Pixel 105 of a focal plane array provides input to column cell 210 of a read out integrated circuit. In embodiments, pixel 105 comprises a long integration sample output 115 and a short integration sample output 120. In embodiments, column cell 210 provides a 3:1 Mux with selection criteria 215, and comprises an Analog to Digital Converter (ADC) 220. The 3:1 Mux in column cell 210 supports selecting between pixel inputs of: 1) high-gain, long integration time, 2), standard-gain, long integration time, and 3) short integration time for extra high saturation flux scenes. Output of column cell 210 comprises gain 230 and data 235 to output data Mux 240.

Figure 3:
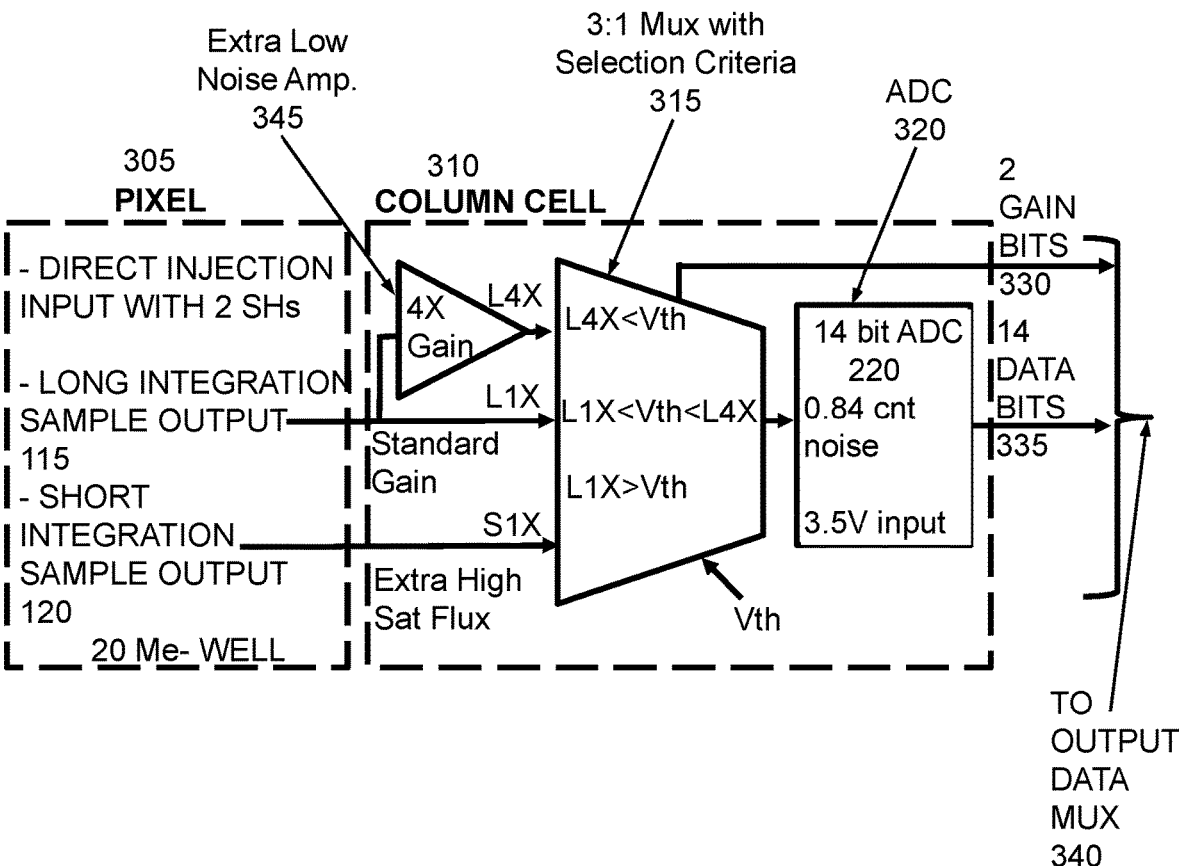
FIG. 3 is a depiction of a pixel and a ROIC column cell embodiment detail configured in accordance with one embodiment of the invention.

FIG. 3 depicts a pixel and a ROIC column cell embodiment detail 300. As in FIG. 1, pixel, here 305, provides input to column cell, now 310, of a read out integrated circuit. Pixel 305 comprises a long integration sample output 115 and a short integration sample output 120. In one example, pixel 305 comprises direct injection input with two sample-and-holds (SHs), and a 20 Me– well. In embodiments, column cell 310 comprises a 4× gain extra low noise amplifier 345, and 3:1 Mux with selection criteria 315. As will be discussed later, a 4× gain lowers the ADC component of ROIC noise by 4×. As mentioned, 3:1 selection Mux 315 comprises three inputs: 1) high-gain, long integration time L4×, 2) standard-gain, long integration time L1×, and 3) short integration time S1× for extra high saturation flux scenes, plus threshold input Vth. L4× is the 4× gain output of amplifier 345 that receives long integration sample output 115 from pixel 305. Standard gain L1× is a direct input of long integration sample output 115 from pixel 305. Extra-high saturated flux S1× is a direct input of short integration sample output 120 from pixel 305.

According to one example, the selection criteria are as follows. L4× is selected for output if L4× is less than threshold Vth. L1× is selected for output if threshold Vth is between L1× and L4×. S1× is selected for output if L1× is greater than threshold Vth. In addition to the selected output, 3:1 selection Mux 315 also provides gain output 330, here, two bits. The selected 3:1 Mux 315 output is provided to ADC 320. ADC 320 in this example comprises 0.84 cnt noise and a 3.5 volt input. Output of column cell 310 comprises the two gain bits 330 and 14 data bits 335 to output data Mux 340. Embodiments employ pseudo-differential follower output with folded cascade output for sufficient separation of input and output voltages with 3× and 4× gains.

In embodiments, a 4× gain lowers the ADC component of ROIC noise by 4× if long integration is less than 25% full. This lowers the total ROIC noise floor by about 3× (kTC noise also a factor). If the well is more than 25% full, Background Limited IR Performance (BLIP) noise is more than 2× higher than 1× gain ROIC read noise. The short integration time increases the maximum saturation flux by the ratio of the long to short integration time, which, in embodiments, the system controls. The switch point short integration signal over max hot scene (72 C) is so large that no 4× gain is needed for SNR≥10, even for an integration time ratio of 500. In this example 20Me–/1000=20 Ke–, BLIP=141 e–, Noise=360 e–, SNR=55.

Figure 4:
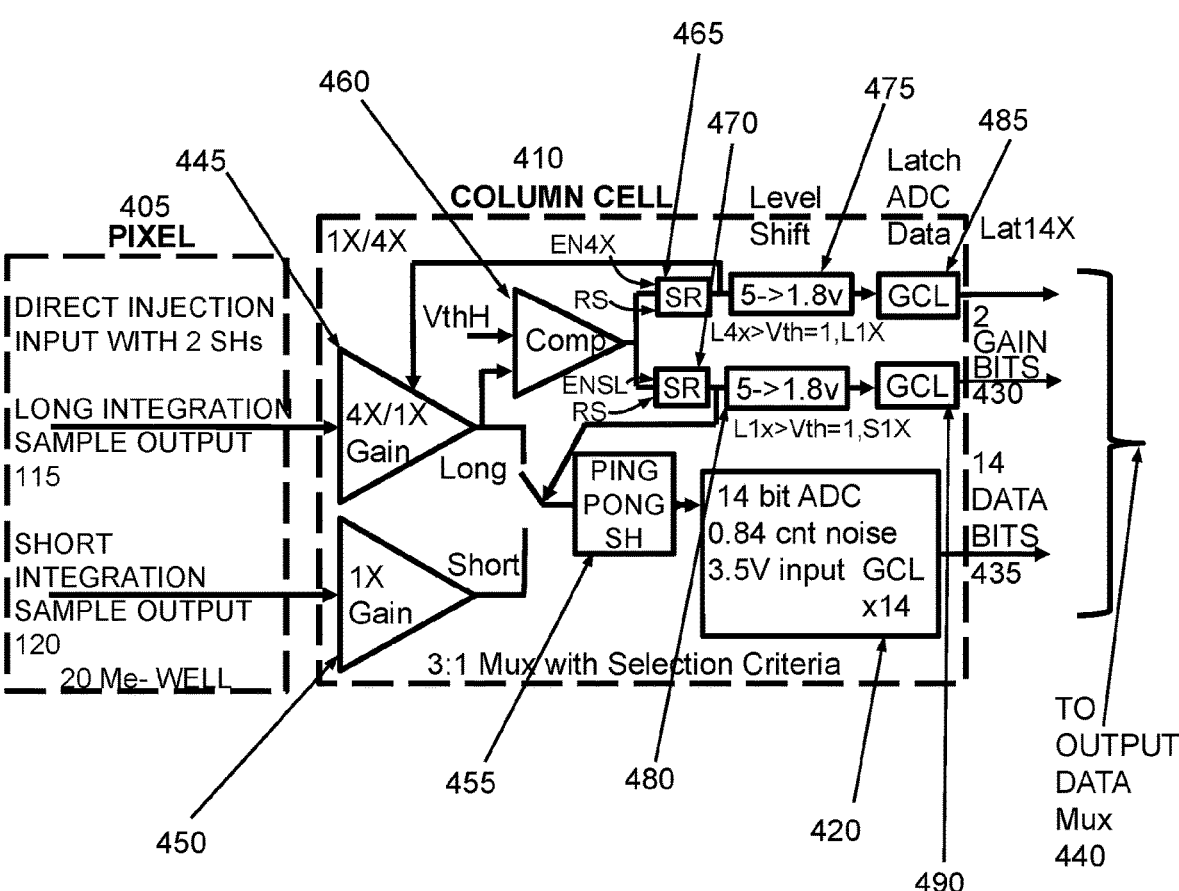
FIG. 4 is a depiction of another pixel and a ROIC column cell embodiment detail configured in accordance with one embodiment of the invention.

FIG. 4 depicts another pixel and a ROIC column cell embodiment detail 400. As discussed in FIG. 3, the high dynamic range ROIC system output uses three gain states (into the 3:1 MUX for the FIG. 3 embodiment). Pixel 405 provides input to column cell 410 of a read out integrated circuit. As in FIG. 1, pixel 405 comprises a long integration sample output 115 and a short integration sample output 120. Pixel 405 comprises direct injection input with two sampleand-holds (SHs), and a 20 Me– well. In embodiments, column cell 410 comprises 4×/1× gain amplifier 445 receiving input from long integration sample output 115. 1× gain amplifier 450 receives input from short integration sample output 120. Ping-pong sample-and-hold 455 switches between the outputs of amplifiers 445 and 450. In addition to providing an input to output from ping-pong sample-and-hold 455, 4×/1× gain amplifier 445 also provides an input to comparator 460 which also receives threshold voltage, high voltage threshold (VthH). In embodiments, the threshold voltage is determined by the saturation characteristics of the pixels, and their outputs. It prevents digitizing of saturated pixel output signals by the ADC, thereby increasing the dynamic range of the system. Output of gain comparator (Comp) 460 is provided to Set-Reset latches (SRs) 465 and 470. SR 465 includes first phase readout gain selection (EN4×) and RS and provides input to 475 where 5→1.8v when L4x>Vth, and =1, L1x. SR 470 includes second phase integration time selection (ENSL) and RS and provides input to 480 where 5→1.8v when L1x>Vth, and =1, S1x and then to gain readout data latches GCLs 485 and 490, respectively. GCLs 485 and 490 provide 2 gain bits 430. 14 bit ADC 420 receives output from ping-pong sample-and-hold 455. In embodiments, ADC 420 comprises 0.84 cnt noise a 3.5 volt input, and GCL×14 to provide a 14 bit data output to data Mux 440. Components 475, 480, 485, and 490 provide level shift, and latch ADC data.

In operation, gain comparator 460 checks the output of the pixel long integration signal 115 multiplied by the readout gain to see if it exceeds the max signal range limit, VthH. The comparator 460 output is latched in set-reset latches, labelled SR 465 and SR 470. SR latches are used to lock in the gain decision for each pixel. The gain is reset to the high gain at the start of each line. Once it is changed, it cannot be changed back for that pixel. There are enables for each type of gain (EN4× for the first phase readout gain selection and ENSL for second phase integration time selection) so that the comparator 460 output is put in the correct latch of SR 465 and SR 470. These latched gain bits determine which signal is saved in the Ping Pong SH 455 and then converted by the analog to digital converter 420. The gain data (2 bits) is latched in readout data latches (GCL) 485 and 490 along with the digital signal level data (14 bits in this example). Then all the 16 bits of data is read out for that pixel.

Figure 5:
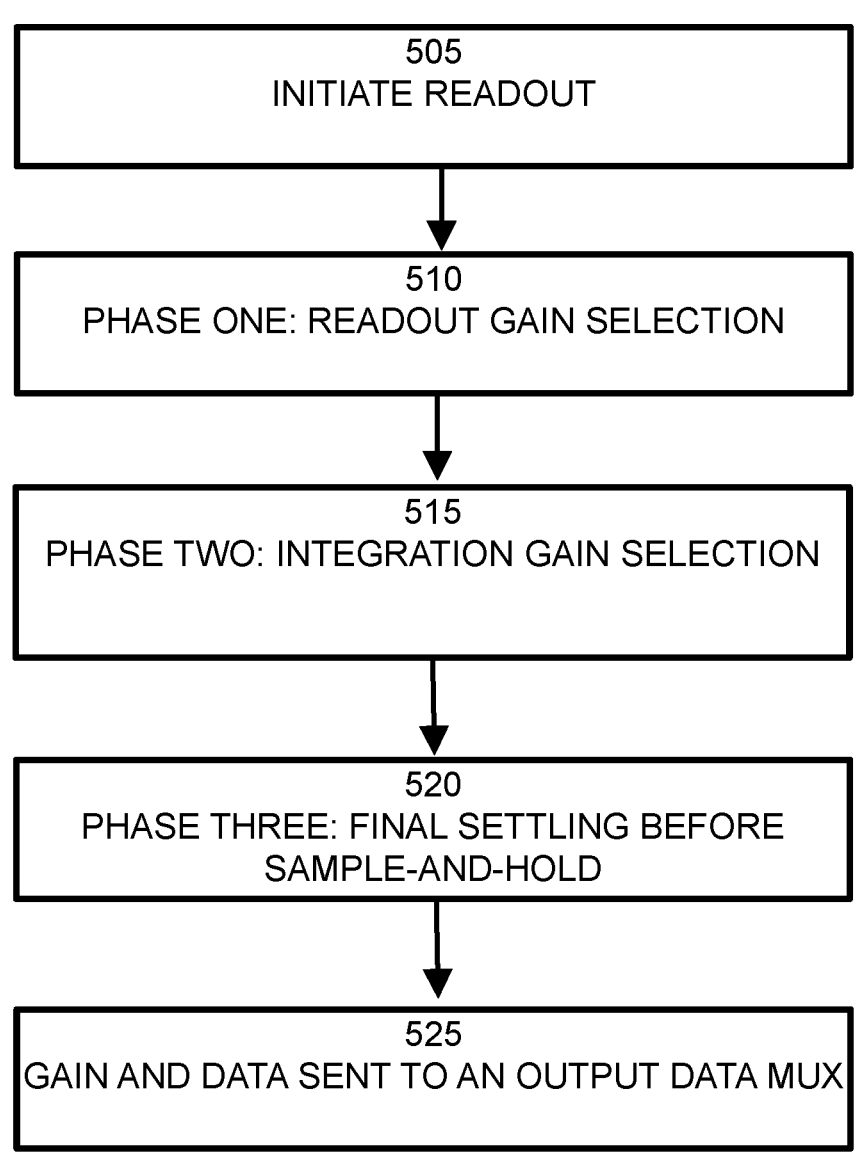
FIG. 5 is a method of operation flow chart configured in accordance with one embodiment of the invention.

FIG. 5 is a flow chart 500 depicting readout phases. In embodiments there is a three phase readout from pixel to column Sample-and-Hold (SH). Readout is initiated 505. In Phase One 510, readout gain is selected. In Phase Two 515, integration gain is selected. In Phase Three 520, the final settling is accomplished before sample-and-hold. Lastly, gain and data are sent to an output data Mux 525. All decisions are specific to individual pixel signals. They start with the highest gain, and switch to lower gains if the output is saturated high.

As above, the gain decision process is done in three phases during the pixel to column SH readout. The pixel samples long and short integration time and sends both outputs to the column cell in the periphery. The decision for each pixel is made in the column cell. First high gain is implemented. During a first period of the readout, a comparator in the column cell sees if the output exceeds the max range limit. If so, the low readout gain is selected which makes it now the middle gain. During a second period of the readout, the same comparator again checks to see if the output exceeds the max range limit. If so, the short integration time is selected. If not, the long integration is maintained. A third period of the readout is used for settling prior to the sample and hold. Since all gain decisions are made based on the long integration time, the short integration does not even need to be read out unless it is selected based on the long integration. This is summarized in TABLE 1 below.

TABLE 1

| Three Phase Readout from Pixel to Column SH | | | |
|---|---|---|---|
| | Phase 1 | Phase 2 | Phase 3 |
| Function | Select readout gain | Select integration gain | Final settling before sample and hold |
| Configuration | Start long integration readout in high readout gain | Long integration readout with readout gain from Phase 1 | Maintain integration and readout gains from Phase 1 & 2 Connect to sample and hold capacitor for final settling |
| Decision | If output > threshold, switch to low readout gain | If output > threshold, switch to short integration readout | None |

TABLE 1 presents readout operational steps from each pixel to the column sample and hold capacitors for an extended range from very low to very high fluxes. The operational steps have three phases. Each phase is characterized by its Function, its Configuration, and its Decision. 'Function' means the purpose of that phase toward the objective of obtaining an image from scenes having very low to very high fluxes. 'Configuration' means the initial integration time and gain values used at each phase. 'Decision' means the logic applied to the data to determine if integration time and gain should be changed from the initial default configuration.

Readout gain selection refers to the gain applied to the pixel output (long integration time and short integration time). As seen in the embodiments of FIGS. 3 and 4, gain values include none (1×) and 4 times (4×). Final settling refers to the time waited before reading a varying signal so that it is stable, to ensure accuracy.

Specifically, regarding Functions, Phase 1 has the Function of selecting the readout gain, the Function of Phase 2 is to select the integration gain, the Function of Phase 3 is final settling before the sample and hold capacitor. Regarding Configuration, Phase 1 begins with a long integration readout, in high readout gain; Phase 2 begins with long integration readout with the readout gain from Phase 1; and Phase 3 begins with the integration and readout gains from Phase 1 and Phase 2. Regarding Decision, the Decision in Phase 1 is: if the output is greater than the threshold, readout gain is switched to low readout gain; the Decision in Phase 2 is: if the output is greater than the threshold, then switch to short integration readout; there is no Decision in the Phase 3 final settling phase.

Figure 6:
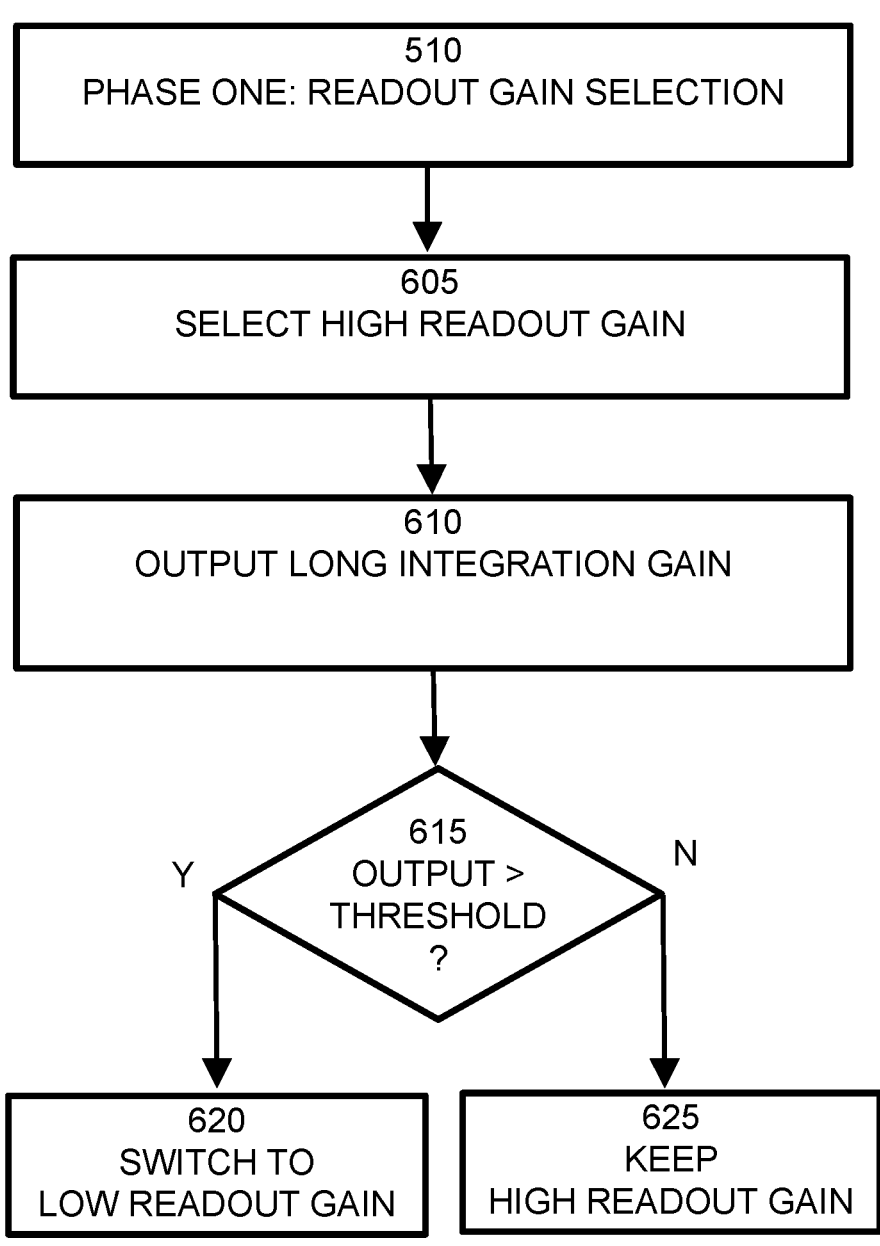
FIG. 6 is a detail flow chart configured in accordance with one embodiment of the invention.

FIG. 6 is a flow chart 600 depicting details of Readout Phase One 410. In Phase One 510, readout gain is selected. High gain is initially implemented. Readout gain selection starts with a long integration readout 605 in high readout gain configuration 610. During the first period of the readout, a comparator in the column cell sees if the output exceeds the maximum range limit. If so, the low readout gain is selected which makes it now the middle gain.

Therefore, if the output is greater than the threshold 615, switch to low readout gain 620; if the output is not greater than the threshold, keep high readout gain 625.

Figure 7:
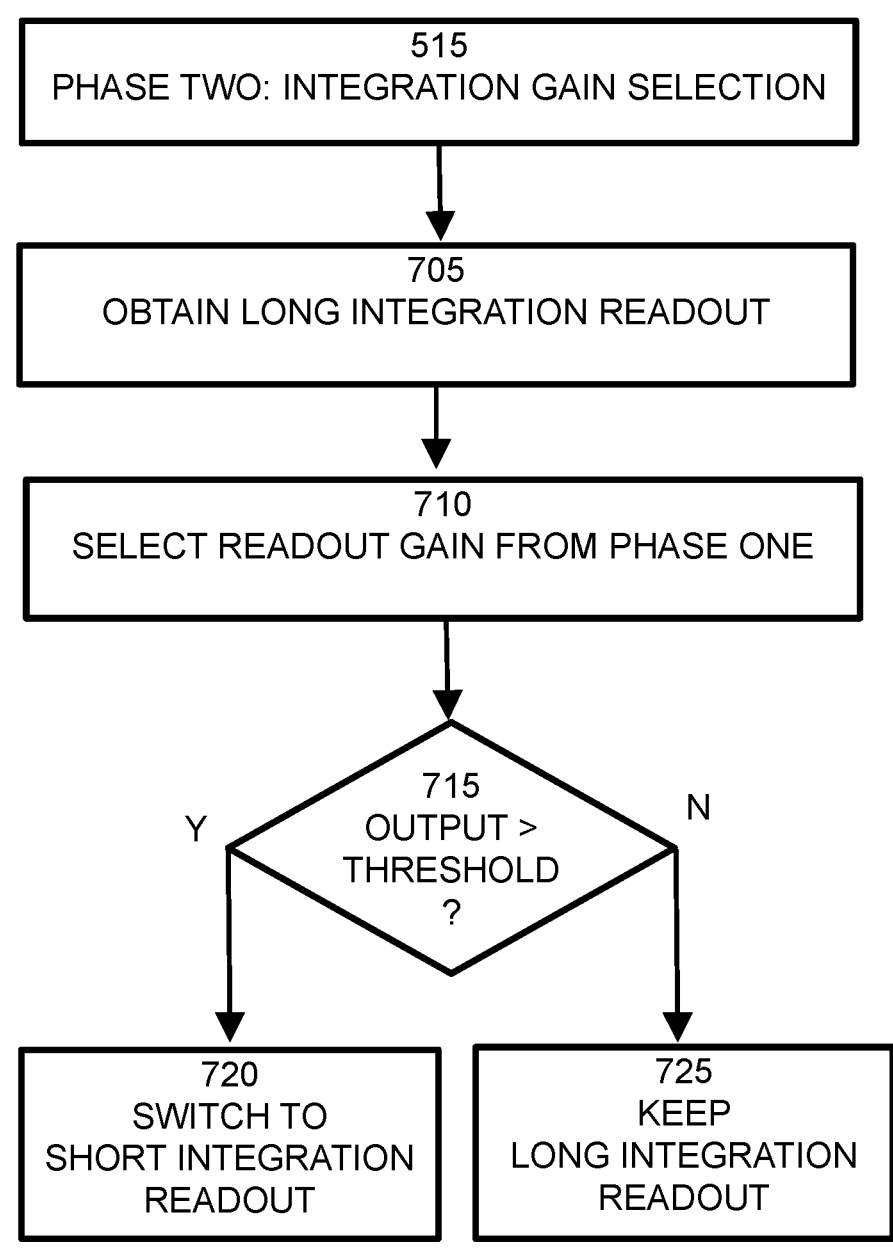
FIG. 7 is a detail flow chart configured in accordance with one embodiment of the invention.

FIG. 7 is a flow chart 700 depicting details of Readout Phase Two 415. In Phase Two 515, long integration readout is obtained 705. Readout gain from Phase One is selected 710. Then, if the output is greater than the threshold 715, switch to short integration readout 720; if the output is not greater than the threshold, keep the long integration readout 725. More particularly, during a second period of the readout, the same comparator again checks to see if the output exceeds the max range limit. If so, the short integration time is selected. If not, the long integration is maintained.

Figure 8:
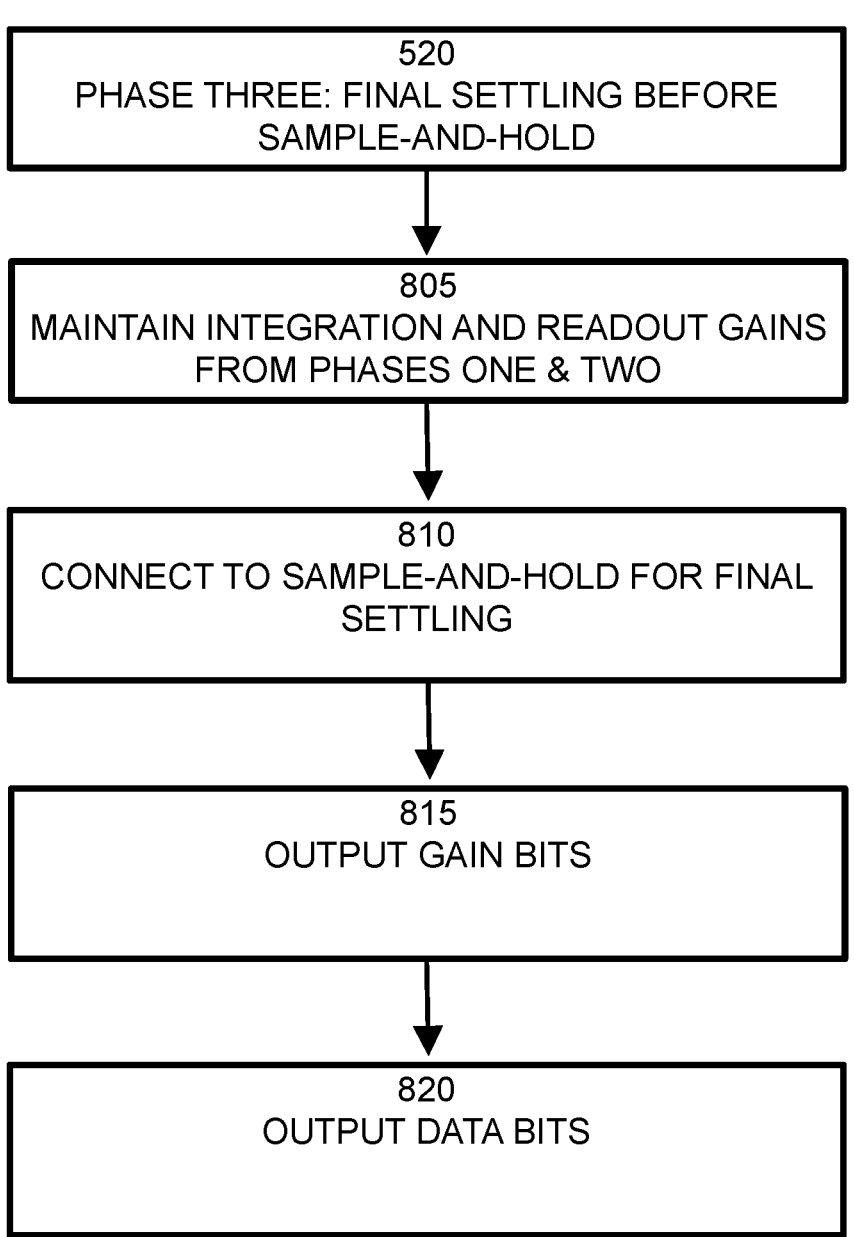
FIG. 8 is a detail flow chart configured in accordance with one embodiment of the invention.

FIG. 8 is a flow chart 800 depicting details of Readout Phase Three 520. In Phase Three 520, the final settling is accomplished before sample-and-hold. In final settling, the integration and readout gains are maintained from Phases One and Two 805, outputs are connected to the sample and hold capacitor for final settling 810; gain bits are output 815; and data bits are output 820. Particularly, the third period of the readout is used for settling prior to the sample and hold. Since all gain decisions are made based on the long integration time, the short integration does not even need to be read out unless it is selected based on the long integration.

Following the previous general description, three examples of three gain automatic gain operation are given: Example (1) Sequential Gain Decisions During readout Time with one Output bus, two RowSelect (L & S), one Receiver/SH; Example (2) Sequential Gain Decisions During readout Time with two Output busses (L & S), one RowSelect, one Receiver/SH; and Example (3) Sequential for long, Parallel for short with 2 output busses, one RowSelect, two Receivers/SHs. All three include a 29.4 us line time and a 26.7 us readout time.

Embodiments for Example (1) Sequential Gain Decisions During readout Time with one Output bus, two RowSelect (L & S), one Receiver/SH comprise 8 μs to decide for 4×L to 1×L, 7 us to decide 1×L to 1×S for 1×L to settle, and 11.7 μs to settle if 1×S, L disconnected. This Example further comprises one output bus with sequential Selects using two row select busses; one differential receiver and one SH. L bias is similar to Example (2), no S, so 6×. This Example is characterized by big reductions in the number of column cell components, some increase in power, and less speed/range/ linearity margin.

Embodiments for Example (2) Sequential Gain Decisions During readout Time with two Output busses (L & S), one RowSelect, one Receiver/SH comprise 8 us to decide for 4×L to 1×L (no SH, bus mostly settled), 7 us to decide 1×L to 1×S (1×L with SH, mostly settled), and 11.7 us to settle if 1×S (1×L or 4×L can also settle) with SH. Two output busses & one row select, but only one receiver and one SH driven, switch receiver to short if selected (already at 1× gain), two output busses per pixel means eight output busses per column. One differential receiver and one SH or two diff receivers (1 4× and 1 1× only) and one 1 SH. 4×L receiver settles in ⅔ time (2×1.5=3× power). This Example further comprises 1×S bus full time, 1×S SH that settles in ⅓ time but the bus starts at right place (2× power). Power is 5×.

Embodiments for Example (3) Sequential for long, Parallel for short with two output busses, one RowSelect, two Receivers/SHs comprise 13 μs to decide 4×L to 1×L, 14 μs to settle for 1×L, and 26.7 μs to settle for 1×S. This Example further comprises two output busses with two receivers driving two SHs, Select long/short SH cap after readout done. L bias is 2× for 4×, 2× for half the time, so 4×, S bias is 1×, so 5× total. This Example is characterized by the most circuits, least power, and most settling time/speed margin.

Embodiments include three Parallel without SH, then gain decision for settling on one SH. One color, 1× only for power comparison. One bus the settles in one line time in 1× gain only, this power is considered 1×.

The foregoing description of the embodiments of the invention has been presented for the purposes of illustration and description. It is not intended to be exhaustive or to limit the invention to the precise form disclosed. Many modifications and variations are possible in light of this disclosure it is to be understood that other similar embodiments may be used or modifications or additions may be made to the described embodiment for performing the same function of the present invention without deviating therefrom. It is intended that the scope of the invention be limited not by this detailed description, but rather by the claims appended hereto.

A number of implementations have been described. Nevertheless, it will be understood that various modifications may be made without departing from the scope of the disclosure. Although operations are depicted in the drawings in a particular order, this should not be understood as requiring that such operations be performed in the particular order shown or in sequential order, or that all illustrated operations be performed, to achieve desirable results.

What is claimed is:

1. A device for imaging having both integration time gain and readout gain comprising:
 a plurality of pixels comprising a frame, each said pixel comprising:
  a first integration time output; and
  a second integration time output, wherein a duration time of said first integration time output is shorter than a duration time of said second integration time output;
 a Read Out Integrated Circuit (ROIC) comprising:
  at least one column cell comprising:
   a gain selection component wherein each of said first integration time output and said second integration time output are compared to a threshold, producing gain bits; and
   an Analog to Digital Converter (ADC) producing data bits from said first integration time output and said second integration time output of each of said plurality of pixels;
 wherein said column cell outputs said data bits from said ADC and said gain bits for each of said plurality of said pixels; and
 wherein a short integration time increases a maximum saturation flux by a ratio of a second integration time to a first integration time, which said device controls.

2. The device of claim 1, wherein each of said gain bits and said data bits is read out for each said pixel for each said frame.

3. The device of claim 1, wherein gain selection of said gain selection component is based on said first integration time output signal and said second integration time output signal of that pixel for that frame.

4. The device of claim 1, wherein said gain bits comprise two bits and said data bits comprise 14 bits.

5. The device of claim 1, wherein said pixel comprises direct injection input with two Sample-and-Holds (SHs).

6. The device of claim 1, wherein said pixel comprises a 20 Me− well.

7. The device of claim 1, wherein said column cell comprises:

an extra low noise amplifier and a 3:1 Mux with selection criteria;

wherein said extra low noise amplifier receives input from said long integration time output and provides input to said 3:1 Mux with selection criteria, wherein said 3:1 Mux with selection criteria comprises three inputs and provides input to said ADC which provides said data bits output from said column cell.

8. The device of claim 1, wherein said column cell comprises:

a first amplifier receiving input from said long integration sample output;

a second amplifier receiving input from said short integration sample output;

a ping-pong sample-and-hold that switches between outputs of said first amplifier and said second amplifier;

a comparator receiving input from said first amplifier and an input of said threshold, wherein said threshold is a threshold voltage VthH, wherein an output of said comparator is provided to a latch providing said gain bits;

wherein said ping-pong sample-and-hold provides input to said ADC.

9. A method for imaging having both integration time gain and readout gain comprising:

receiving, at a plurality of pixels, photons from an image;

providing a first, short, integration time output and a second, long, integration time output from each pixel of said plurality of pixels;

receiving said short integration time output and said long integration time output at a gain selection component of a column cell of a Read Out Integrated Circuit (ROIC);

comparing, in said gain selection component of said column cell, said pixel long integration time output and a gain to at least one threshold;

determining a data bit output and a gain bit output from said comparison;

whereby a dynamic range of said imaging method is extended;

wherein said method comprises three phases comprising:

a first phase comprising selection of said readout gain;

a second phase comprising selection of said integration time gain; and a third phase comprising final settling before sample and hold.

10. The method of claim 9 wherein said first phase readout gain selection comprises:

establishing said readout gain in a high gain configuration;

comparing a value of said long integration time output to a readout gain threshold;

if said long integration time output value is greater than said readout gain threshold, then switching said high readout gain to a low readout gain configuration.

11. The method of claim 9 wherein said second phase integration time gain selection comprises:

comparing a value of said long integration time output multiplied by a readout gain to an integration time gain threshold;

if said long integration time output value multiplied by said readout gain is greater than said integration time gain threshold, then switching to said short integration time output.

12. The method of claim 9 wherein said third phase final settling comprises:

maintaining a readout gain and an integration time gain;

connecting to a capacitor of said sample-and-hold for final setting;

outputting said gain bits; and outputting said data bits.

13. The method of claim 9 wherein a readout gain threshold equals an integration time gain threshold.

14. The method of claim 9 wherein said three phases are time periods in a readout line.

15. The method of claim 9 wherein readout starts at a highest readout gain and lowers said gain if output exceeds said threshold.

16. The method of claim 9, wherein a short integration time increases a maximum saturation flux by a ratio of a long integration time to a short integration time, which the system controls.

17. The method of claim 9 wherein a short integration time increases a maximum saturation flux by a ratio of a long integration time to a short integration time, wherein said ratio is controlled by said imaging method.

18. A system for imaging having both integration time gain and readout gain comprising:

a plurality of pixels comprising a frame, each said pixel comprising:

a direct injection input with two Sample-and-Holds (SHs);

a short integration time output; and a long integration time output, whereby said integration time gain extends a range to higher fluxes with shorter integration times;

a Read Out Integrated Circuit (ROIC) comprising:

at least one column cell comprising:

a gain selection component wherein each of said short integration time output and said long integration time output are compared to a threshold producing gain bits; and an Analog to Digital Converter (ADC) producing data bits;

wherein a first phase readout gain selection comprises:

establishing said readout gain in a high gain configuration;

comparing a value of said long integration time output to a readout gain threshold;

if said long integration time output value is greater than said readout gain threshold, then switching said high readout gain to a low readout gain configuration;

wherein a second phase integration time gain selection comprises:

comparing a value of said long integration time output multiplied by a readout gain to an integration time gain threshold;

if said long integration time output value multiplied by said readout gain is greater than said integration time gain threshold, then switching to said short integration time output;

wherein a third phase final settling comprises:

maintaining a readout gain and an integration time gain;

connecting to a capacitor of said sample-and-hold for final setting;

outputting said gain bits; and outputting said data bits;

wherein said column cell outputs said data bits from said ADC and said gain bits for each said pixel;

whereby a dynamic range of said imaging device is extended.

* * * * *